United States Patent
Noh

(10) Patent No.: US 8,081,538 B2
(45) Date of Patent: Dec. 20, 2011

(54) SEMICONDUCTOR MEMORY DEVICE AND DRIVING METHOD THEREOF

(75) Inventor: Young-Kyu Noh, Gyeonngi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 199 days.

(21) Appl. No.: 12/490,826

(22) Filed: Jun. 24, 2009

(65) Prior Publication Data

US 2010/0277992 A1 Nov. 4, 2010

(30) Foreign Application Priority Data

Apr. 30, 2009 (KR) .................. 10-2009-0038528

(51) Int. Cl.
*G11C 8/00* (2006.01)

(52) U.S. Cl. .......... 365/233.1; 365/189.04; 365/189.14; 365/189.15; 365/189.16; 365/189.17; 365/189.05; 365/189.07; 365/233.11; 365/233.12; 365/233.16; 365/233.17; 365/233.19; 365/236

(58) Field of Classification Search ............ 365/189.04, 365/189.14, 189.15, 189.16, 189.17, 189.05, 365/189.07, 233.1, 233.11, 233.12, 233.16, 365/233.17, 233.19, 236
See application file for complete search history.

(56) References Cited

U.S. PATENT DOCUMENTS

| 2008/0170446 A1 | 7/2008 | Kwon et al. |
| 2009/0063917 A1 | 3/2009 | Tokunaga et al. |
| 2009/0089538 A1 | 4/2009 | Yeh et al. |
| 2009/0115450 A1 | 5/2009 | Kim et al. |

FOREIGN PATENT DOCUMENTS

| JP | 2008-226458 | 9/2008 |
| JP | 2009-59434 | 3/2009 |
| KR | 100328673 | 3/2002 |
| KR | 1020050123003 | 12/2005 |
| KR | 101002378 | 12/2010 |
| WO | WO2009037770 | * 3/2009 |

* cited by examiner

*Primary Examiner* — Fernando Hidalgo
(74) *Attorney, Agent, or Firm* — IP & T Group LLP

(57) ABSTRACT

A semiconductor memory device includes output enable signal generation means configured to be reset in response to an output enable reset signal, count a DLL clock signal and an external clock signal, and generate an output enable signal in correspondence to a read command and an operating frequency; and activation signal generation means configured to generate an activation signal for inactivating the output enable signal generation means during a write operation interval.

6 Claims, 5 Drawing Sheets

SEMICONDUCTOR MEMORY DEVICE AND DRIVING METHOD THEREOF

CROSS-REFERENCE TO RELATED APPLICATIONS

The present application claims priority of Korean Patent Application No. 10-2009-0038528, filed on Apr. 30, 2009, the disclosure of which is incorporated herein by reference in its entirety.

BACKGROUND OF THE INVENTION

The present invention relates to a semiconductor design technique, and more particularly, to a semiconductor memory device which generates an output enable signal and performs data input and output operation using the output enable signal.

In general, a semiconductor memory device such as a double data rate synchronous DRAM (DDR SDRAM) is inputted with a read command synchronized with an external clock signal and outputs data synchronized with an internal clock signal during read operation. That is to say, not the external clock signal but the internal clock signal is used to output data in the semiconductor memory device. Due to this fact, in the read operation, the read command synchronized with the external clock signal is desired to be synchronized with the internal clock signal. That is to say, in the position of the read command, a clock signal to be synchronized with is changed from the external clock signal to the internal clock signal. This change of a signal to be synchronized with from one clock signal to another clock signal is called "domain crossing."

In the semiconductor memory device, various circuits for performing domain crossing operation are provided. One of these circuits is an output enable signal generation circuit. The output enable signal generation circuit synchronizes the read command transmitted in synchronization with the external clock signal with the internal clock signal, and outputs an output enable signal. At this time, the output enable signal having completely undergone the domain crossing operation includes CAS latency (CL) information. The semiconductor memory device operates using the output enable signal such that data to be outputted can be outputted at a desired time after the read command as if the data are synchronized with the external clock signal. Meanwhile, CAS latency has information indicating a delay from a timing point that the read command is applied for a unit time corresponding to one period of the external clock signal to a timing point that the data should be outputted. The CAS latency is stored in a mode register set built in the semiconductor memory device. The CAS latency can be used as an index for determining the operating frequency of the semiconductor memory device.

Meanwhile, a skew may occur between the external clock signal and the internal clock signal due to delay factors in the semiconductor memory device. In order to compensate for the a skew, an internal clock signal generation circuit is provided in the semiconductor memory device. Typically, internal clock signal generation circuits include a phase locked loop and a delay locked loop. In the present specification, a DLL clock signal generated by the delay locked loop will be exemplarily used as an internal clock signal.

FIG. 1 is a block diagram illustrating a conventional circuit for generating an output enable signal in a semiconductor memory device.

Referring to FIG. 1, an output enable signal generation circuit includes a counter reset signal generation section 110, an initialization section 120, a DLL clock counting section 130, a delay model section 140, an external clock counting section 150, a latching section 160, and a comparison section 170.

The counter reset signal generation section 110 synchronizes an output enable reset signal RST_OE with a DLL clock signal CLK_DLL and generates a DLL clock counter reset signal RST_DLL. The output enable reset signal RST_OE is a signal that is activated by an external command or an internal signal of a semiconductor memory device when resetting the output enable signal generation circuit.

The initialization section 120 provides an initial counting value corresponding to a CAS latency CL, to the DLL clock counting section 130. That is to say, the initialization section 120 sets an output signal S<0:2> corresponding to the CAS latency CL as the initial counting value of the DLL clock counting section 130.

The DLL clock counting section 130 is reset in response to the DLL clock counter reset signal RST_DLL and counts the DLL clock signal CLK_DLL starting from the initial counting value corresponding to the output signal S<0:2> of the initialization section 120. In other words, the DLL clock counting section 130 generates a DLL clock counting value CNT_DLL<0:2> by counting the DLL clock signal CLK_DLL starting from the initial counting value set according to the CAS latency CL.

The delay model section 140 models a delay difference between an external clock signal CLK_EXT used in a domain crossing circuit and the DLL clock counter reset signal RST_DLL. The delay model section 140 delays the DLL clock counter reset signal RST_DLL by an asynchronous delay time, synchronizes it with the external clock signal CLK_EXT, and generates an external clock counter reset signal RST_EXT.

The external clock counting section 150 is reset in response to the external clock counter reset signal RST_EXT and counts the external clock signal CLK_EXT. In general, the initial counting value of the external clock counting section 150 is set to 0.

The latching section 160 latches an external clock counting value CNT_EXT<0:2> being the output signal of the external clock counting section 150 in response to a read command RD, and outputs a latched external clock counting value CNT_LAT<0:2>.

The comparison section 170 compares the DLL clock counting value CNT_DLL<0:2> and the latched external clock counting value CNT_LAT<0:2> and activates an output enable signal OE at a timing point when the two values become the same. The output enable signal OE outputted in this way is a signal that is synchronized with the DLL clock signal CLK_DLL, and includes the information of the CAS latency CL. Meanwhile, the output enable signal OE is used along with burst length information to output data.

The counter reset signal generation section 110, the initialization section 120, the DLL clock counting section 130, the delay model section 140, the external clock counting section 150, the latching section 160, and the comparison section 170 will be collectively referred to as an "output enable signal generation block." As a result, the output enable signal generation block is reset in response to the output enable reset signal RST_OE, counts the DLL clock signal CLK_DLL and the external clock signal CLK_EXT, and generates the output enable signal OE corresponding to the read command RD and the CAS latency CL.

Meanwhile, a semiconductor memory device has been developed so as to achieve high integration, high speed operation and low power consumption. In this regard, efforts have been made to minimize power consumed in the operation of circuits. The conventional output enable signal generation block includes the DLL clock counting section 130 for counting the DLL clock signal CLK_DLL and the external clock counting section 150 for counting the external clock signal CLK_EXT. Typically, each of the DLL clock counting section 130 and the external clock counting section 150 can comprise a counter which is composed of a plurality of flip-flops and performs counting operation in response to the corresponding clock signal. The counting operation consumes power.

The DLL clock counting section 130 and the external clock counting section 150 according to the conventional art perform counting operation irrespective of read and write operation after banks of the semiconductor memory device become active until they are precharged. Namely, the semiconductor memory device performs counting operation in read and write operation, whereby power consumption occurs. The present invention described below minimizes power consumption due to a counting operation of semiconductor memory device.

SUMMARY OF THE INVENTION

An embodiment of the present invention is directed to providing a semiconductor memory device which can limit counting operation during a write operation interval of a semiconductor memory device.

In accordance with an aspect of the present invention, there is provided a semiconductor memory device includes: output enable signal generation means configured to be reset in response to an output enable reset signal, count a DLL clock signal and an external clock signal, and generate an output enable signal in correspondence to a read command and an operating frequency; and activation signal generation means configured to generate an activation signal for inactivating the output enable signal generation means during a write operation interval.

In accordance with another aspect of the present invention, there is provided a circuit for generating an output enable signal, which includes: a reset signal generation section configured to synchronize an output enable reset signal with a first clock signal and generate a DLL clock counter reset signal; a DLL clock counting section configured to be reset in response to the DLL clock counter rest signal and count the first clock signal starting from an initial counting value; a delay model section configured to delay the DLL clock counter reset signal by a modeled time and output an external clock counter reset signal in sync with a second clock signal; an external clock counting section configured to be reset in response to the external clock counter reset signal and count the second clock signal; a latching section configured to latch an output value of the external clock counting section in response to a read command; a comparison section configured to compare an output value of the DLL clock counting section and an output value of the latching section and output an output enable signal; and a clock control section configured to be inputted with a DLL clock signal and an external clock signal and inactivate the first clock signal corresponding to the DLL clock signal and the second clock signal corresponding to the external clock signal in response to an activation signal that is activated in a write operation.

In accordance with another aspect of the present invention, there is provided a method for driving a semiconductor memory device, which includes: counting a DLL clock signal and an external clock signal by being reset in response to an output enable reset signal; latching a value obtained by counting the external clock signal, in response to a read command that is activated in read operation; comparing the value latched in latching and a value obtained by counting the DLL clock signal, and generating an output enable signal corresponding to an operating frequency; and performing write operation while preventing counting of the DLL clock signal and the external clock signal in response to a write command.

A conventional output enable signal generation circuit performs counting operation in read and write operation of a semiconductor memory device, and due to this fact, power consumption increases. However, since an output enable signal is used only in the read operation of the semiconductor memory device, it is not needed during a write operation interval. That is to say, the output enable signal generation circuit can be inactivated during the write operation interval. In the present invention, an output enable signal generation circuit which is inactivated during a write operation interval is provided, whereby it is possible to minimize power consumption of a semiconductor memory device.

DESCRIPTION OF SPECIFIC EMBODIMENT

Other objects and advantages of the present invention can be understood by the following description, and become apparent with reference to the embodiment of the present invention.

Figure 1:
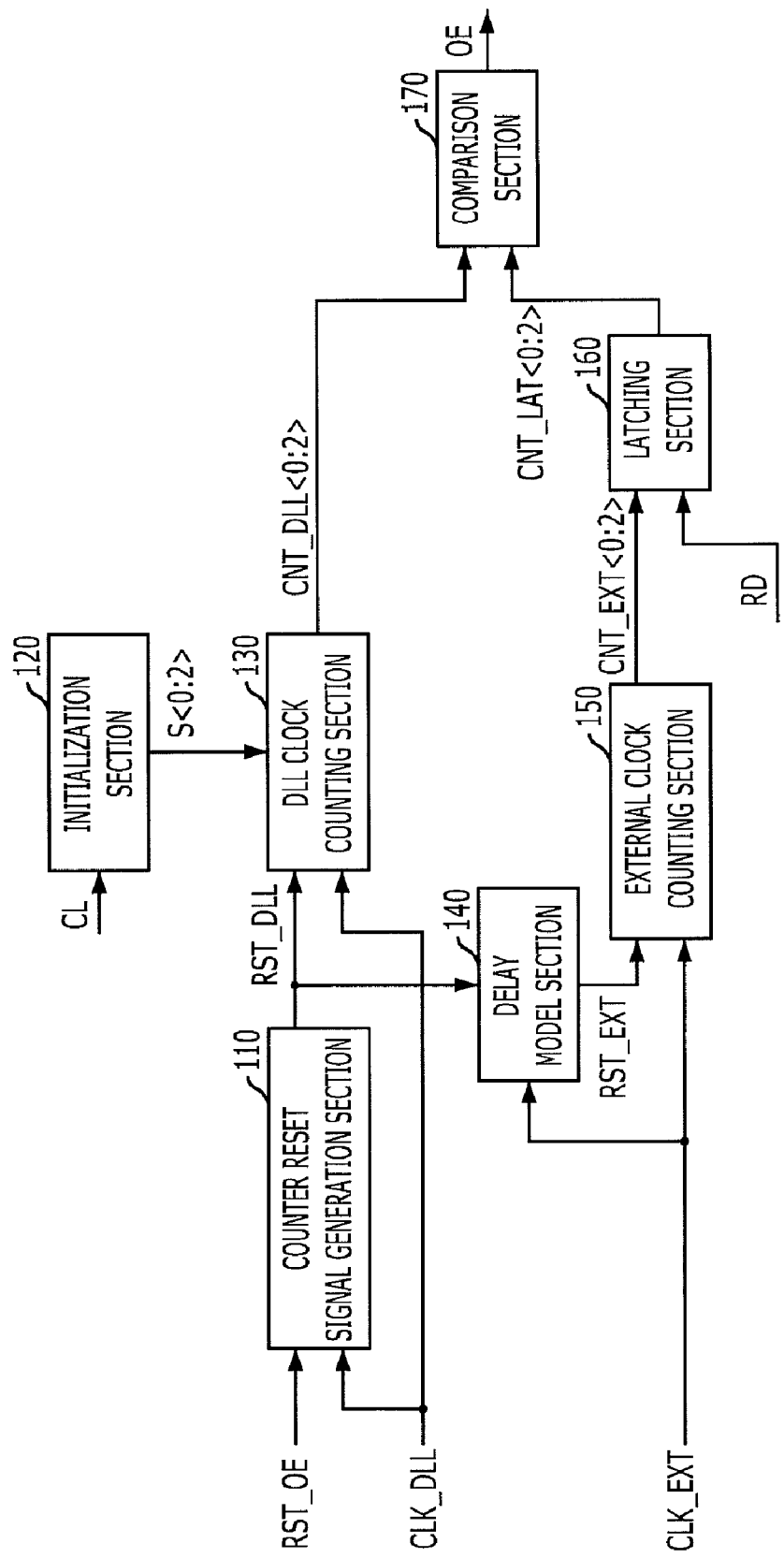
FIG. 1 is a block diagram illustrating a conventional circuit for generating an output enable signal in a semiconductor memory device.
Figure 2:
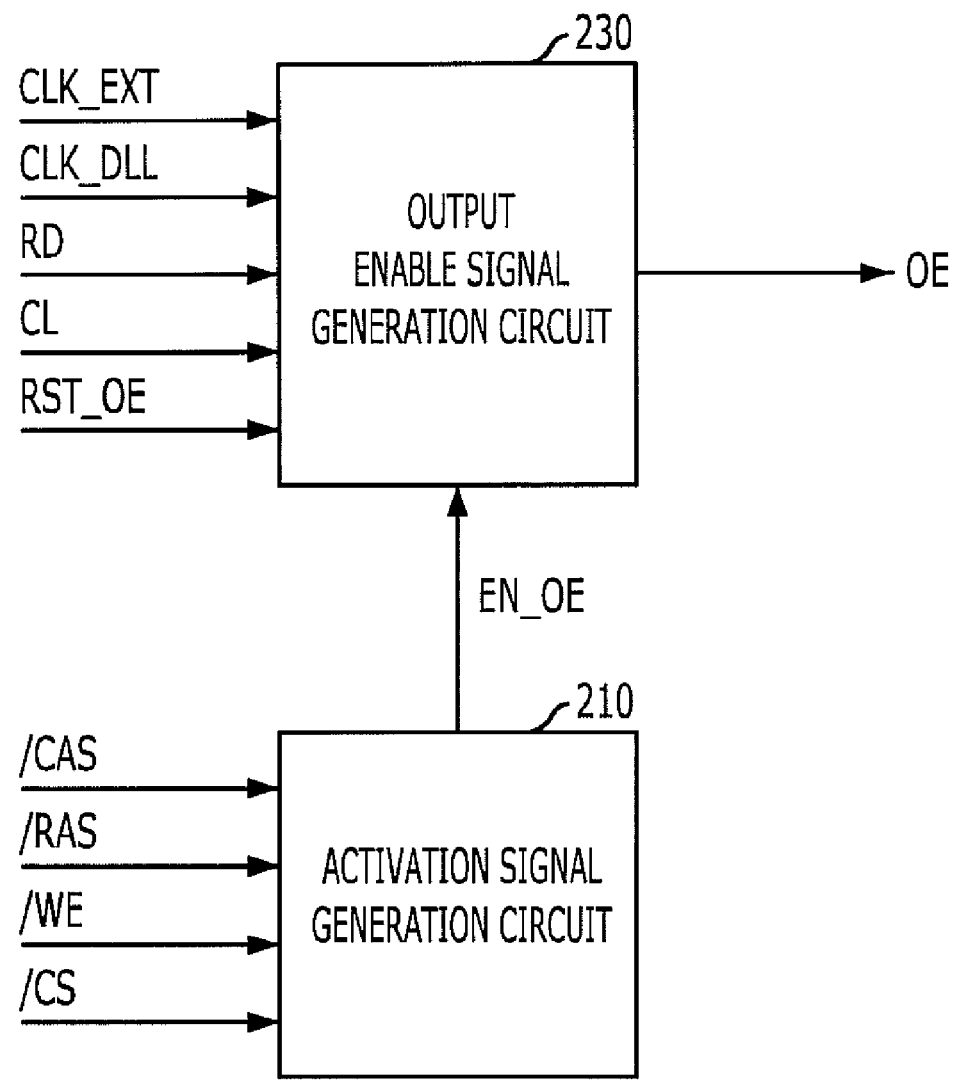
FIG. 2 is a block diagram illustrating a partial configuration of a semiconductor memory device in accordance with an embodiment of the present invention.

FIG. 2 is a block diagram illustrating a partial configuration of a semiconductor memory device in accordance with an embodiment of the present invention.

Referring to FIG. 2, a semiconductor memory device includes an activation signal generation circuit 210 and an output enable signal generation circuit 230.

The activation signal generation circuit 210 generates an activation signal EN_OE for inactivating the output enable signal generation circuit 230 during a write operation. The activation signal generation circuit 210 generates the activation signal EN_OE in response to a column address strobe signal (/CAS), a row address strobe signal (/RAS), a chip select signal (/CS) and a write enable signal (/WE). The column address strobe signal (/CAS), the row address strobe signal (/RAS), the chip select signal (/CS) and the write enable signal (/WE) are external command signals. The semiconductor memory device performs active operation, read operation, write operation and precharge operation in response to the external command signals. In particular, the activation signal EN_OE according to the present invention is activated during the write operation and inactivates the output enable signal generation circuit 230.

The output enable signal generation circuit 230 is reset in response to an output enable reset signal RST_OE, counts a DLL clock signal CLK_DLL and an external clock signal CLK_EXT, and generates an output enable signal OE corresponding to a read command RD and an operating frequency. Here, the operating frequency can correspond to a CAS latency CL.

Since the output enable signal generation circuit 230 according to the present invention is inactivated in response to the activation signal EN_OE during the write operation, it is possible to minimize power consumed by the output enable signal generation circuit 230. This will be described in detail as an embodiment.

Figure 3:
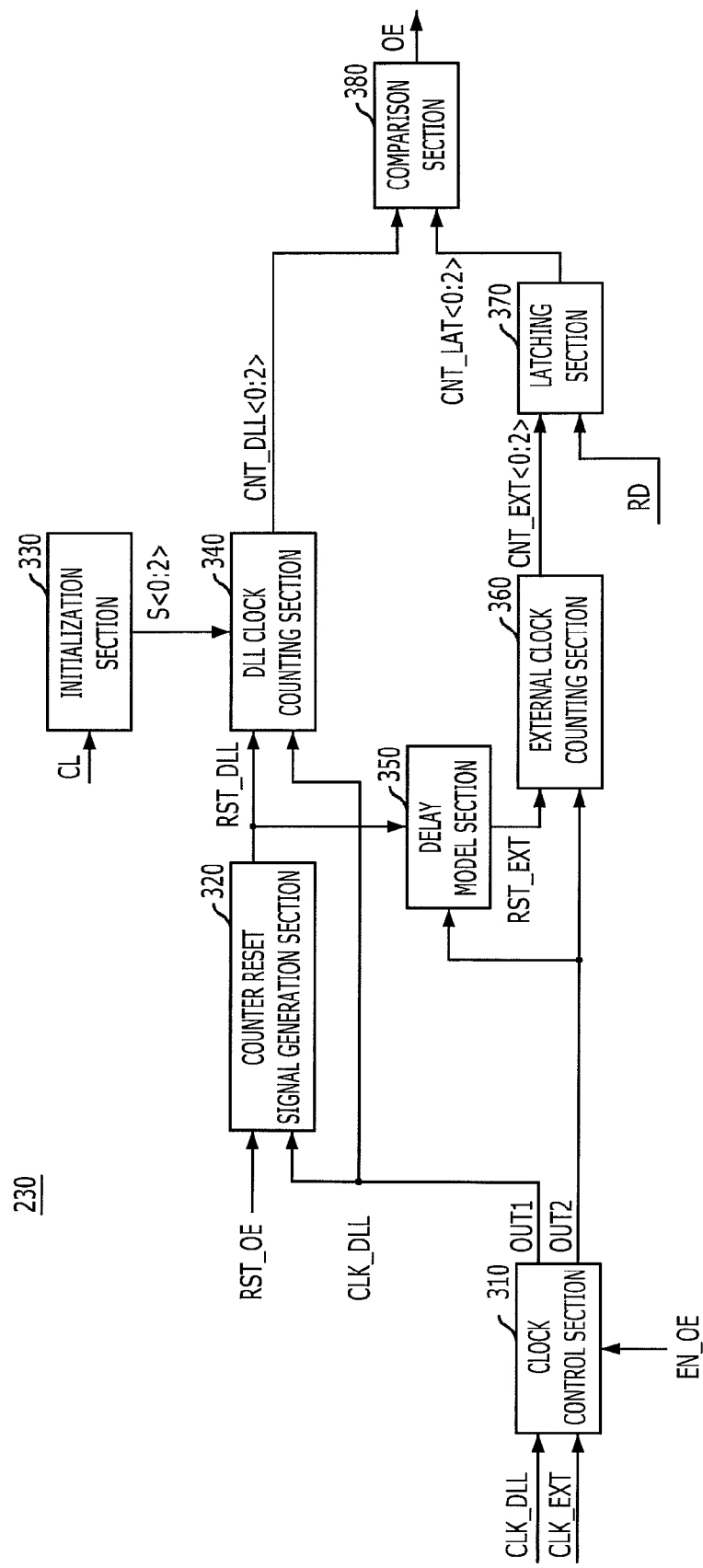
FIG. 3 is a block diagram illustrating an output enable signal generation circuit of FIG. 2.

FIG. 3 is a block diagram illustrating the output enable signal generation circuit 230 of FIG. 2.

Referring to FIG. 3, the output enable signal generation circuit 230 includes a clock control section 310, a counter reset signal generation section 320, an initialization section 330, a DLL clock counting section 340, a delay model section 350, an external clock counting section 360, a latching section 370, and a comparison section 380.

The clock control section 310 is inputted with the DLL clock signal CLK_DLL and the external clock signal CLK_EXT, and generates a first output clock signal OUT1 and a second output clock signal OUT2 in response to the activation signal EN_OE that is activated during the write operation. The first output clock signal OUT1 and the second output clock signal OUT2 are clock signals that are outputted in response to the activation signal EN_OE and respectively correspond to the DLL clock signal CLK_DLL and the external clock signal CLK_EXT.

The counter reset signal generation section 320 synchronizes the output enable reset signal RST_OE with the first output clock signal OUT1 and generates a DLL clock counter reset signal RST_DLL. The output enable reset signal RST_OE is a signal that is activated by an external command or an internal signal of the semiconductor memory device when resetting the output enable signal generation circuit 230.

The initialization section 330 provides an initial counting value corresponding to the CAS latency CL, to the DLL clock counting section 340. That is to say, the initialization section 330 sets an output signal S<0:2> corresponding to the CAS latency CL as the initial counting value of the DLL clock counting section 340.

The DLL clock counting section 340 is reset in response to the DLL clock counter reset signal RST_DLL and counts the first output clock signal OUT1 starting from the initial counting value corresponding to the output signal S<0:2> of the initialization section 330. In other words, the DLL clock counting section 340 generates a DLL clock counting value CNT_DLL<0:2> by counting the first output clock signal OUT1 starting from the initial counting value set according to the CAS latency CL.

The delay model section 350 models a difference between the external clock signal CLK_EXT used in a domain crossing circuit and the DLL clock signal CLK_DLL. The delay model section 350 delays the DLL clock counter reset signal RST_DLL by an asynchronous delay time corresponding to the difference, synchronizes it with the second output clock signal OUT2, and generates an external clock counter reset signal RST_EXT.

The external clock counting section 360 is reset in response to the external clock counter reset signal RST_EXT and counts the second output clock signals OUT2. In general, the initial counting value of the external clock counting section 360 is set to 0.

The latching section 370 latches an external clock counting value CNT_EXT<0:2> being the output signal of the external clock counting section 360 in response to a read command RD, and outputs a latched external clock counting value CNT_LAT<0:2>.

The comparison section 380 compares the DLL clock counting value CNT_DLL<0:2> and the latched external clock counting value CNT_LAT<0:2> and activates an output enable signal OE at a timing point when the two values become the same. The output enable signal OE outputted in this way is a signal that is synchronized with the first output clock signal OUT1 corresponding to the DLL clock signal CLK_DLL, and includes the information of the CAS latency CL. Meanwhile, the output enable signal OE is used along with burst length information to output data.

Figure 4:
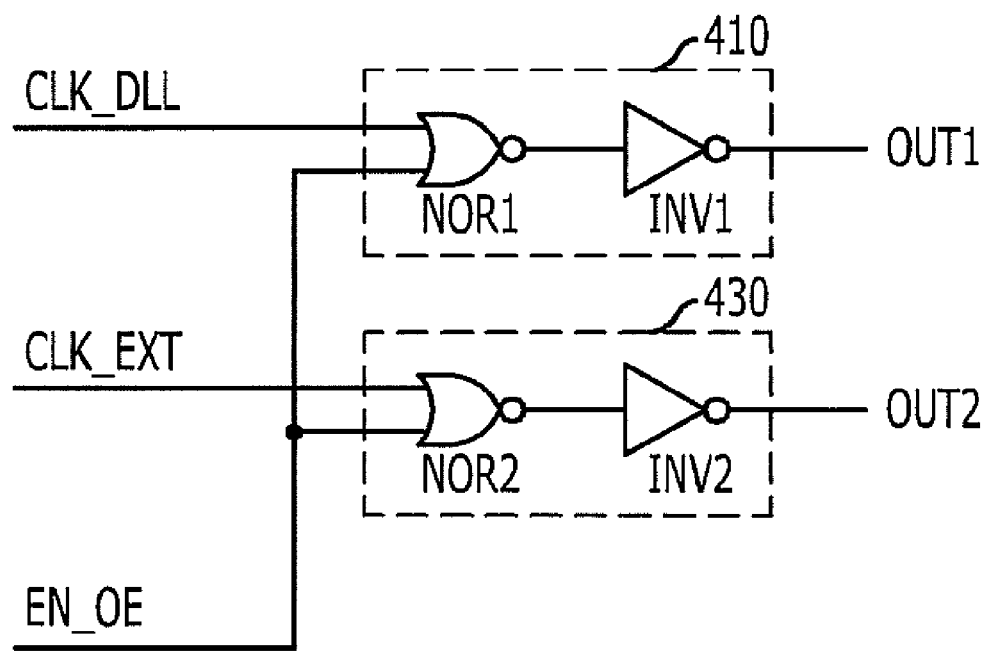
FIG. 4 is a circuit diagram illustrating a clock control section of FIG. 3.

FIG. 4 is a circuit diagram illustrating the clock control section 310 of FIG. 3.

Referring to FIG. 4, the clock control section 310 includes a first clock control unit 410, which generates the first output clock signal OUT1 in response to the DLL clock signal CLK_DLL, and the activation signal EN_OE and a second clock control unit 430, which generates the second output clock signal OUT2 in response to the external clock signal CLK_EXT and the activation signal EN_OE.

The first clock control unit 410 is to control the toggling operation of the first output clock signal OUT1 outputted in correspondence to the DLL clock signal CLK_DLL, in response to the activation signal EN_OE. The first clock control unit 410 includes a first NOR gate NOR1 which is inputted with the DLL clock signal CLK_DLL and the activation signal EN_OE, and a first inverter INV1 which is inputted with the output signal of the first NOR gate NOR1 and outputs the first output clock signal OUT1.

The second clock control unit 430 is to control the toggling operation of the second output clock signal OUT2 outputted in correspondence to the external clock signal CLK_EXT, in response to the activation signal EN_OE. The second clock control unit 430 includes a second NOR gate NOR2 which is inputted with the external clock signal CLK_EXT and the activation signal EN_OE, and a second inverter INV2 which is inputted with the output signal of the second NOR gate NOR2 and outputs the second output clock signal OUT2.

While the logic level value of the activation signal EN_OE will be described later with reference to FIG. 5, the activation signal EN_OE is activated, for example, to a logic 'high' during the write operation interval. When the activation signal EN_OE has a logic 'low', the first clock control unit 410 outputs the first output clock signal OUT1 that toggles in correspondence to the DLL clock signal CLK_DLL, and when the activation signal EN_OE has a logic 'high', the toggling operation of the first output clock signal OUT1 is prevented. Similar to the first clock control unit 410, in the second clock control unit 430, the second output clock signal OUT2 toggles in correspondence to the external clock signal CLK_EXT or the toggling operation is prevented, in response to the activation signal EN_OE.

The operation of the semiconductor memory device according to the present invention will be briefly described with reference again to FIGS. 3 and 4.

First, in the operation interval of the semiconductor memory device that requires the output enable signal OE, especially, in the read operation interval, the activation signal EN_OE becomes a logic 'low', the first output clock signal OUT1 that toggles in correspondence to the DLL clock signal CLK_DLL is generated, and the second output clock signal OUT2 that toggles in correspondence to the external clock signal CLK_EXT is generated. Accordingly, the DLL clock counting section 340 and the external clock counting section 360 perform counting operation according to the corresponding output clock signals, and the output enable signal OE is generated in correspondence to the read command RD and the CAS latency CL.

Conversely, in the operation interval of the semiconductor memory device that does not require the output enable signal OE, especially, in the write operation interval, the activation signal EN_OE becomes a logic 'high', the first output clock signal OUT1 and the second output clock signal OUT2 are prevented from toggling. Accordingly, since the first and second output clock signals OUT1 and OUT2 do not toggle, the DLL clock counting section 340 and the external clock counting section 360 do not perform counting operation any more. Therefore, it is to be noted that whether or not the DLL clock counting section 340 and the external clock counting section 360 perform the counting operation is decided by the activation signal EN_OE. That is to say, the DLL clock counting section 340 and the external clock counting section 360 are inactivated in their counting operation when the activation signal EN_OE has a logic 'high' and perform the counting operation when the activation signal EN_OE has a logic 'low'.

Figure 5:
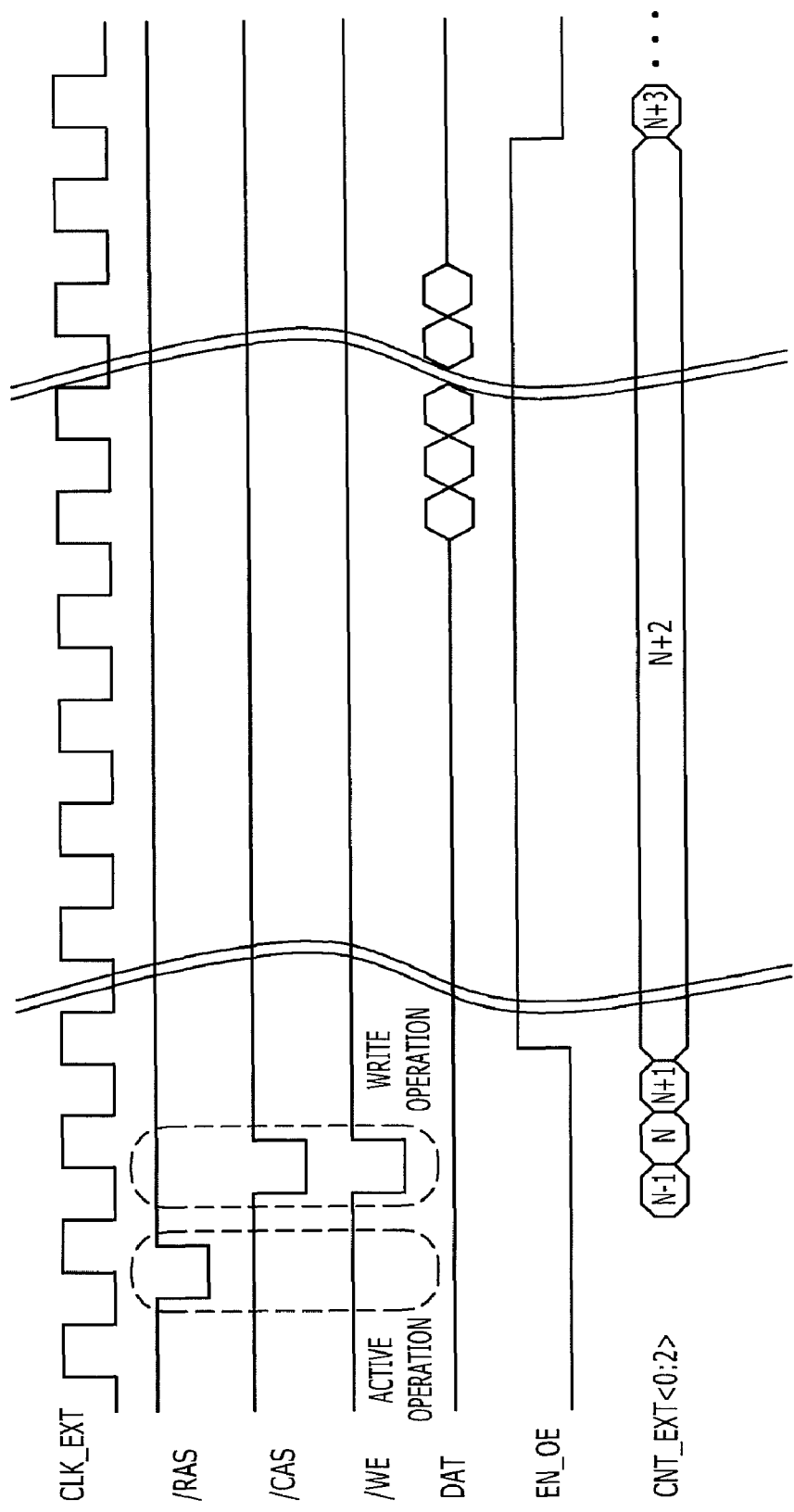
FIG. 5 is a timing diagram illustrating partial operation timing of the semiconductor memory device according to the present invention.

FIG. 5 is a timing diagram illustrating partial operation timing of the semiconductor memory device according to the present invention. For illustration purposes, the counting operation of the external clock counting section 360 will be explained as an example. As described above with reference to FIG. 4, when the activation signal EN_OE has a logic 'low', the second output clock signal OUT2 toggles in correspondence to the external clock signal 'CLK_EXT, and when the activation signal EN_OE has a logic 'high', the second output clock signal OUT2 does not toggle irrespective of the external clock signal CLK_EXT. In other words, while the second output clock signal OUT2 is not shown in FIG. 5, the toggling operation, that is, the activation, of the second output clock signal OUT2 is determined depending upon the activation signal EN_OE.

Referring to FIGS. 3 through 5, the activation signal EN_OE changes from a logic 'low' to a logic 'high' when performing write operation after active operation. As can be readily seen from the drawings, before the activation signal EN_OE changes to a logic 'high', the external clock counting section 360 performs counting operation in response to the second output clock signal OUT2 corresponding to the external clock signal CLK_EXT, and if the activation signal EN_OE changes to a logic 'high', the external clock counting section 360 does not perform counting operation since the second output clock signal OUT2 is prevented from toggling. Here, it is preferred that the external clock counting section 360 maintain the external clock counting vale CNT_EXT<0:2> of the time when the counting operation is interrupted in the logic 'high' interval of the activation signal EN_OE.

Then, during the logic 'high' interval of the activation signal EN_OE, data DAT corresponding to the write operation are inputted, and thereafter, the activation signal changes to a logic 'low'. The external clock counting section 360 performs again the counting operation in response to the activation signal EN_OE and generates the external clock counting value CNT_EXT<0:2> that is obtained in response to the second output clock signal OUT2 corresponding to the external clock signal CLK_EXT. A timing point when the activation signal EN_OE is inactivated to a logic 'low' can be changed depending upon a design. In the present embodiment, it is exemplified that the activation signal EN_OE is inactivated after all the data DAT corresponding to the write operation have been applied. If the semiconductor memory device requires the counting operation at an earlier time, the activation signal EN_OE can be inactivated to a logic 'low' before the inactivation time shown in FIG. 5. This procedure can be performed in the same manner for the DLL clock counting section 340. The timing diagram and the explanation of operation for the DLL clock counting section 340 will be omitted herein.

In the foregoing manner, in the semiconductor memory device according to the present invention, by inactivating the output enable signal generation circuit 230 during the write operation, power consumption by the output enable signal generation circuit 230 can be minimized. In particular, by preventing the counting operation of the DLL clock counting section 340 and the external clock counting section 360 of the clock enable signal generation circuit 230 during the write operation interval, power consumption by the counting operation can be reduced.

Meanwhile, the activation signal EN_OE can be designed in a variety of ways. For example, the activation signal EN_OE that is activated in a write operation can be generated by decoding an external command or can be designed to be linked with a signal for controlling the activation operation of an input buffer which is built in the semiconductor memory device. Meanwhile, in the case of the input buffer, it can operate in the read operation of the semiconductor memory device, and the activation signal EN_OE according to the present invention can be generated using a signal for controlling the input buffer.

Although it was described in the aforementioned embodiment of the present invention that the output signal S<0:2> of the initialization section 330, the DLL clock counting value CNT_DLL<0:2>, the external clock counting value CNT_EXT<0:2>, and the latched external clock counting value CNT_LAT<0:2> are composed of three bits, the design of these signals can be changed depending upon an operating frequency.

Furthermore, the positions and the types of logic gates and transistors in the foregoing embodiments are exemplary and may be implemented in a different manner depending upon the polarities of input signals.

As is apparent from the above description, in the present invention, by inactivating an output enable signal generation circuit in a write operation interval, power consumption of a semiconductor memory device can be minimized.

While the present invention has been described with respect to the specific embodiment, it will be apparent to those skilled in the art that various changes and modifications may be made without departing from the spirit and scope of the invention as defined in the following claims.

What is claimed is:

1. A circuit for generating an output enable signal, comprising:
   a reset signal generation section configured to synchronize an output enable reset signal with a first clock signal and generate a DLL clock counter reset signal;
   a DLL clock counting section configured to be reset in response to the DLL clock counter rest signal and count the first clock signal starting from an initial counting value;
   a delay model section configured to delay the DLL clock counter reset signal by a modeled time and output an external clock counter reset signal in sync with a second clock signal;
   an external clock counting section configured to be reset in response to the external clock counter reset signal and count the second clock signal;

a latching section configured to latch an output value of the external clock counting section in response to a read command;

a comparison section configured to compare an output value of the DLL clock counting section and an output value of the latching section and output an output enable signal; and a clock control section configured to be inputted with a DLL clock signal and an external clock signal and inactivate the first clock signal corresponding to the DLL clock signal and the second clock signal corresponding to the external clock signal in response to an activation signal that is activated in a write operation.

2. The circuit of claim 1, further comprising:

activation signal generation means configured to generate the activation signal in response to external commands.

3. The circuit of claim 1, further comprising:

an initialization section configured to provide the initial counting value to the DLL clock counting section in response to a CAS latency corresponding to an operating frequency.

4. The circuit of claim 1, wherein the clock control section comprises:

a first clock control unit configured to control toggling operation of the first clock signal outputted in correspondence to the DLL clock signal, in response to the activation signal; and a second clock control unit configured to control toggling operation of the second clock signal outputted in correspondence to the external clock signal, in response to the activation signal.

5. A method for driving a semiconductor memory device, comprising:

counting a DLL clock signal and an external clock signal by being reset in response to an output enable reset signal;

latching a value obtained by counting the external clock signal, in response to a read command that is activated in read operation;

comparing the value latched in latching and a value obtained by counting the DLL clock signal, and generating an output enable signal corresponding to an operating frequency; and performing write operation, while preventing counting of the DLL clock signal and the external clock signal in response to a write command, wherein performing of the write operation comprises:

generating an activation signal that is activated in a write operation interval: and inactivating toggling operation of the DLL clock signal and the external clock signal in response to the activation signal.

6. The method of claim 5, wherein the activation signal is activated in response to external commands that are activated in the write operation interval.

* * * * *